(12) United States Patent
Ishida et al.

(10) Patent No.: US 10,756,026 B2
(45) Date of Patent: Aug. 25, 2020

(54) SEMICONDUCTOR DEVICE AND METHOD OF MANUFACTURING THE SAME

(71) Applicant: Mitsubishi Electric Corporation, Chiyoda-ku, Tokyo (JP)

(72) Inventors: Kiyoshi Ishida, Tokyo (JP); Yukinobu Tarui, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/306,499

(22) PCT Filed: May 29, 2017

(86) PCT No.: PCT/JP2017/019858
§ 371 (c)(1),
(2) Date: Nov. 30, 2018

(87) PCT Pub. No.: WO2017/212965
PCT Pub. Date: Dec. 14, 2017

(65) Prior Publication Data
US 2019/0295959 A1    Sep. 26, 2019

(30) Foreign Application Priority Data
Jun. 8, 2016    (JP) ................................ 2016-114540

(51) Int. Cl.
*H01L 23/552*    (2006.01)
*H01L 21/48*    (2006.01)
(Continued)

(52) U.S. Cl.
CPC ........ *H01L 23/552* (2013.01); *H01L 21/4817* (2013.01); *H01L 21/56* (2013.01);
(Continued)

(58) Field of Classification Search
None
See application file for complete search history.

(56) References Cited

U.S. PATENT DOCUMENTS

2009/0194852 A1* 8/2009 Chiu .................... H01L 23/552
257/660
2011/0175210 A1   7/2011 Yao et al.
(Continued)

FOREIGN PATENT DOCUMENTS

| JP | 2008042152 A | 2/2008 |
| JP | 5022652 B2 | 6/2012 |
| JP | 56-33582 B | 12/2014 |

OTHER PUBLICATIONS

Extended European Search Report for corresponding European Application No. 17810144.0, dated Mar. 18, 2019, 10 pages.
(Continued)

*Primary Examiner* — Ali Naraghi
(74) *Attorney, Agent, or Firm* — Buchanan Ingersoll & Rooney PC

(57) ABSTRACT

A semiconductor device functioning properly by maintaining an electromagnetic shielding structure by a conductor layer is provided. A semiconductor device includes a wiring board having a surface, a semiconductor element, an insulating layer, and a conductor layer. The semiconductor element is arranged on the surface of the wiring board. The insulating layer is located on the surface of the wiring board and arranged to surround the semiconductor element. The conductor layer covers an outer peripheral surface of the insulating layer, and is connected to the wiring board. The outer peripheral surface of the insulating layer includes an upper surface located over the semiconductor element, and a side surface connecting the upper surface and the wiring (Continued)

board. The side surface includes a reverse tapered portion. The conductor layer is in contact with a surface of the reverse tapered portion.

9 Claims, 11 Drawing Sheets

(51) Int. Cl.
   *H01L 21/56*    (2006.01)
   *H01L 21/78*    (2006.01)
   *H01L 23/31*    (2006.01)
   *H01L 23/66*    (2006.01)
   *H01L 23/28*    (2006.01)
   *H01L 23/00*    (2006.01)

(52) U.S. Cl.
   CPC ............ *H01L 21/561* (2013.01); *H01L 21/78* (2013.01); *H01L 23/00* (2013.01); *H01L 23/28* (2013.01); *H01L 23/3121* (2013.01); *H01L 23/66* (2013.01); *H01L 24/45* (2013.01); *H01L 24/48* (2013.01); *H01L 24/97* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/73265* (2013.01); *H01L 2224/97* (2013.01); *H01L 2924/15313* (2013.01); *H01L 2924/181* (2013.01); *H01L 2924/1815* (2013.01); *H01L 2924/3025* (2013.01)

(56) References Cited

U.S. PATENT DOCUMENTS

2015/0303075 A1\* 10/2015 Han .................... H01L 25/0657
                                                                438/113
2017/0186708 A1\*  6/2017 Li ........................ H01L 23/3185

OTHER PUBLICATIONS

International Search Report (with English Translation) and Written Opinion issued in corresponding International Patent Application No. PCT/JP2017/019858, 9 pages, dated Aug. 15, 2017.

\* cited by examiner

SEMICONDUCTOR DEVICE AND METHOD OF MANUFACTURING THE SAME

TECHNICAL FIELD

The present invention relates to a semiconductor device having contained therein a semiconductor element, and a method of manufacturing the same.

BACKGROUND ART

Conventionally, there is known a semiconductor device having contained therein a semiconductor element in which a high frequency circuit is formed as an example of a semiconductor element. In such a semiconductor device, a conductor layer as an electromagnetic shielding structure is generally provided to surround the outer periphery of the semiconductor device for the purpose of shielding an electromagnetic wave emitted from the inside to the outside of the semiconductor device, or an electromagnetic wave applied from the outside to the inside of the semiconductor device (see Japanese Patent Laying-Open No. 2008-42152 (PTD 1), for example).

In a semiconductor device described in PTD 1, semiconductor elements are placed on a wiring board, and an insulating layer is provided to surround the upper portions of the semiconductor elements. Furthermore, a conductor layer is provided to surround the insulating layer. The wiring board, the insulating layer and the conductor layer have vertically shaped side surfaces. The lower end of the conductor layer is in contact with the wiring board.

CITATION LIST

Patent Document

PTD 1: Japanese Patent Laying-Open No. 2008-42152

SUMMARY OF INVENTION

Technical Problem

To form an electromagnetic shielding structure by a conductor layer, the lower end of the conductor layer must be in contact with a wiring board, to electrically ground the conductor layer through this wiring board. However, conductor paste commonly used as a material for a conductor layer has the property of dimensionally shrinking when subjected to high temperature for a long period of time. In the technique described in PTD 1, the conductor layer may dimensionally shrink due to heat history during reflow heating of the semiconductor device, for example. In this case, the lower end of the conductor layer, which is a free end of the conductor layer, may be pulled due to the dimensional shrinkage of the conductor layer and peeled from the wiring board. As a result, the conductor layer is no longer grounded and thus the electromagnetic shielding structure can no longer be maintained, resulting in inability of the semiconductor device to function properly.

The present invention was made to solve the problem as described above, and an object of the present invention is to provide a semiconductor device functioning properly by maintaining an electromagnetic shielding structure by a conductor layer.

Solution to Problem

A semiconductor device according to the present embodiment includes a wiring board having a surface, a semiconductor element, an insulating layer, and a conductor layer. The semiconductor element is arranged on the surface of the wiring board. The insulating layer is located on the surface of the wiring board and arranged to surround the semiconductor element. The conductor layer covers an outer peripheral surface of the insulating layer, and is connected to the wiring board. The outer peripheral surface of the insulating layer includes an upper surface located over the semiconductor element, and a side surface connecting the upper surface and the wiring board. The side surface includes a reverse tapered portion. The conductor layer is in contact with a surface of the reverse tapered portion.

Advantageous Effects of Invention

According to the semiconductor device described above, the conductor layer can be grounded through the wiring board to form an electromagnetic shielding structure. Furthermore, since the conductor layer is in contact with the surface of the reverse tapered portion of the side surface of the insulating layer, even if the conductor layer is going to dimensionally shrink when heated during heat treatment in the process of manufacturing the semiconductor device, the portion of the conductor layer in contact with the surface of the reverse tapered portion acts as a position fixing anchor. The dimensional change (shrinkage) of the conductor layer can thereby be suppressed. Therefore, breakage of a connection portion between the wiring board and the conductor layer (for example, separation of the conductor layer from the wiring board) due to this dimensional change can be prevented. As a result, the integrity of the electromagnetic shielding structure by the conductor layer can be maintained, so that the problem of inability of the semiconductor device to operate property due to a failure in this electromagnetic shield can be prevented from occurring.

DESCRIPTION OF EMBODIMENTS

Embodiments of the present invention will be described hereinafter with reference to the drawings. The same or corresponding parts are designated by the same reference numbers in the following drawings and description thereof will not be repeated.

First Embodiment

<Configuration of Semiconductor Device>

Figure 1:
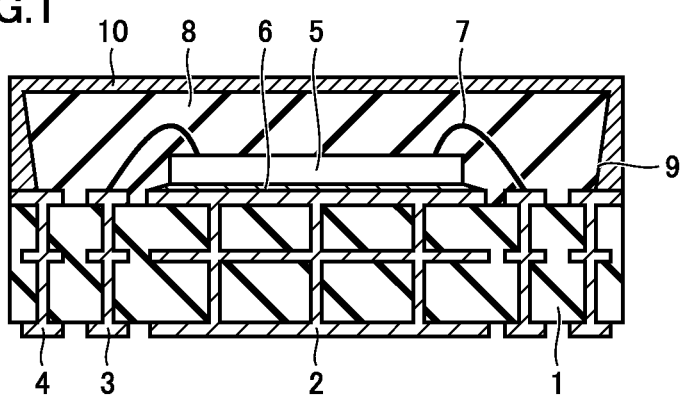
FIG. 1 is a schematic sectional view of a semiconductor device according to a first embodiment.

FIG. 1 is a schematic sectional view of a semiconductor device according to a first embodiment of the present invention. As shown in FIG. 1, the semiconductor device includes a wiring board 1 having a surface, a semiconductor element 5, an insulating layer 8, and a conductor layer 10. Semiconductor element 5 is arranged on the surface of wiring board 1. Insulating layer 8 is located on the surface of wiring board 1 and arranged to surround semiconductor element 5. Conductor layer 10 covers an outer peripheral surface of insulating layer 8, and is connected to wiring board 1. The outer peripheral surface of insulating layer 8 includes an upper surface located over semiconductor element 5, and a side surface connecting this upper surface and wiring board 1. The side surface includes a reverse tapered portion 9. Conductor layer 10 is in contact with a surface of reverse tapered portion 9.

Wiring board 1 is a multilayer printed wiring board. Wiring board 1 should only be such that a conductor can be formed on each of its upper surface and lower surface, and a through conductor can be formed which electrically connects a wiring layer made of the conductor formed on the upper surface and a wiring layer made of the conductor formed on the lower surface. A double-sided printed wiring board, a build-up printed wiring board or the like can be used, for example, as wiring board 1.

A glass epoxy composite material made by impregnating glass cloth with epoxy resin can be used, for example, as a material for wiring board 1. However, any material can be used as long as a conductor which will serve as a wiring layer can be formed on the upper surface and the lower surface, and a through conductor can be formed which electrically connects the wiring layer on the upper surface and the wiring layer on the lower surface as described above. For example, a composite material made by impregnating glass cloth with BT resin may be used as a material for wiring board 1.

A heat dissipating conductor 2, a signal conductor 3 and a grounding conductor 4 are copper wires formed on wiring board 1 which is a multilayer printed wiring board. Heat dissipating conductor 2, signal conductor 3 and grounding conductor 4 as wiring layers each include surface wiring portions formed on the upper surface and the lower surface of wiring board 1, and a through conductor portion extending through wiring board 1 and connecting these surface wiring portions. The through conductor portion extending through wiring board 1 may employ any structure as long as it can electrically connect the surface wiring portion on the upper surface and the surface wiring portion on the lower surface of wiring board 1. For example, this conductor portion may be placed in a hole extending through wiring board 1, and structured such that a central portion thereof is filled with conductive resin.

Heat dissipating conductor 2 is provided at a central portion of the surface of wiring board 1. Signal conductor 3 is provided around heat dissipating conductor 2. Grounding conductor 4 is provided to surround the periphery of signal conductor 3. The surface wiring portions of heat dissipating conductor 2, signal conductor 3 and grounding conductor 4 that are exposed at the upper surface and the lower surface of wiring board 1 may be subjected to surface treatment. As a coating layer formed at the surface wiring portions by this surface treatment, a laminated structure having a nickel plated layer and a gold plated layer laminated on one another may be employed, or a laminated structure having a nickel plated layer, a palladium plated layer and a gold plated layer laminated on one another may be employed.

As shown in FIG. 1, on the upper surface side of wiring board 1, semiconductor element 5 is fixed on an upper surface of heat dissipating conductor 2 with an adhesive 6 interposed therebetween. Any semiconductor material can be used as a material for semiconductor element 5. For example, one of silicon (Si), a gallium arsenide compound, a gallium nitride compound, and a silicon carbide compound may be used. Adhesive 6 is silver paste made by blending silver particles having a diameter of a few hundred nm to a few μm into epoxy-based thermosetting resin which is a base material and uniformly dispersing the particles, for example.

Semiconductor element 5 is electrically connected to an upper surface of signal conductor 3 (a surface of the surface wiring portion) of wiring board 1 through wire 7. Wire 7 is a pure gold wire having a diameter of about 20 for example. However, any material can be used for wire 7 as long as it can electrically connect semiconductor element 5 and signal conductor 3. Silver, copper or aluminum can be used, for example, as a material for wire 7.

Figure 7:
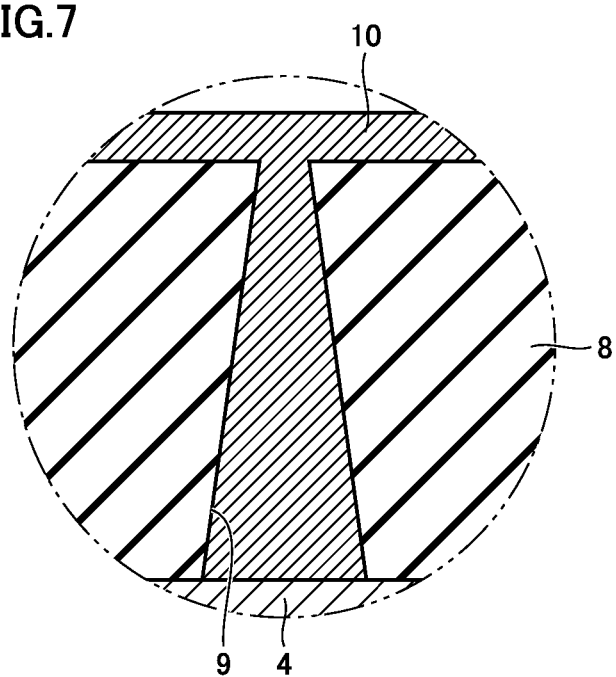
FIG. 7 is a partially enlarged schematic sectional view of FIG. 6.

Insulating layer 8 is provided on the upper surface of wiring board 1 to cover semiconductor element 5. Grounding conductor 4 provided on the outer peripheral side of the surface of wiring board 1 is partially or entirely arranged outside of insulating layer 8. The side surface of insulating layer 8 is provided with reverse tapered portion 9. Reverse tapered portion 9 is an inclined portion of the side surface of insulating layer 8 such that the position of the side surface approaches the outer periphery of wiring board 1 with increasing distance from the end of the side surface on the wiring board 1 side, as shown in FIG. 7. In FIG. 1, the width of insulating layer 8 increases with increasing distance from wiring board 1.

It is noted that reverse tapered portion 9 as used here refers to a portion of the side surface of insulating layer 8 that is structured such that insulating layer 8 protrudes outward from wiring board 1 toward the upper surface of insulating layer 8. Stated from a different perspective, reverse tapered portion 9 refers to a portion of the side surface of insulating layer 8 that is inclined relative to the surface of wiring board 1 and that is arranged such that a surface of this inclined portion faces the surface of wiring board 1.

Reverse tapered portion 9 may be formed around the entire circumference of the side surface of insulating layer 8, or may be formed partially on the side surface in a circumferential direction. Any material can be used as a material forming insulating layer 8. For example, epoxy-based thermosetting resin blended with carbon black or spherical silica can be used. However, insulating layer 8 should only be cured to be able to protect semiconductor element 5 therein, and UV curable resin may be used as a material for insulating layer 8.

Conductor layer 10 is provided to cover the outer peripheral side of the surface (upper surface) of wiring board 1, and the upper surface and the side surface of insulating layer 8. A side surface of conductor layer 10 extends in a direction substantially perpendicular to the surface of wiring board 1. Thus, on reverse tapered portion 9 of insulating layer 8, the thickness of conductor layer 10 (the thickness in a direction along the surface of wiring board 1) increases toward wiring board 1. Conductor layer 10 is a conductor film formed by applying to the surface of insulating layer 8 conductor paste in which metallic particles having a diameter of a few hundred nm to a few μm have been uniformly dispersed into epoxy-based thermosetting resin which is a base material, and then performing heat treatment, for example. Any material can be used as a material for the metallic particles. For example, one of silver, copper, iron and carbon may be used.

On the outer peripheral side of the surface of wiring board 1, grounding conductor 4 exposed at the outer periphery of insulating layer 8 and conductor layer 10 are in contact with each other. Conductor layer 10 is thereby electrically grounded. Thus, conductor layer 10 produces the effect of shielding an electromagnetic wave as an electromagnetic shield. Furthermore, even if conductor layer 10 is going to dimensionally shrink when heat history such as reflow heating is applied to the semiconductor device illustrated in the present embodiment, since a portion of conductor layer 10 that is located on the side surface of insulating layer 8 is shaped to dig into insulating layer 8 at reverse tapered portion 9, the dimensional shrinkage of conductor layer 10 is suppressed by the anchoring effect of this portion. As a result, the problem of the lower end of conductor layer 10 on the outer peripheral side of the side surface of insulating layer 8 being peeled from grounding conductor 4 arranged on the outer peripheral side of wiring board 1 can be prevented from occurring. Accordingly, the semiconductor device illustrated in the present embodiment can function properly without compromising the function of conductor layer 10 of shielding an electromagnetic wave (electromagnetic shielding function).

<Method of Manufacturing Semiconductor Device>

A method of manufacturing the semiconductor device shown in FIG. 1 is described using FIGS. 2 to 7. FIGS. 2 to 7 are schematic diagrams illustrating the method of manufacturing the semiconductor device shown in FIG. 1.

Figure 2:
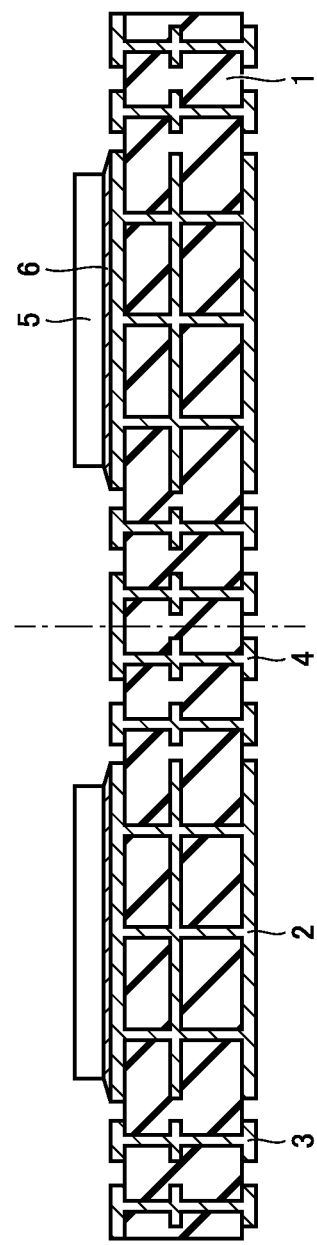
FIG. 2 is a schematic sectional view illustrating a step of manufacturing a semiconductor layer shown in FIG. 1.
Figure 3:
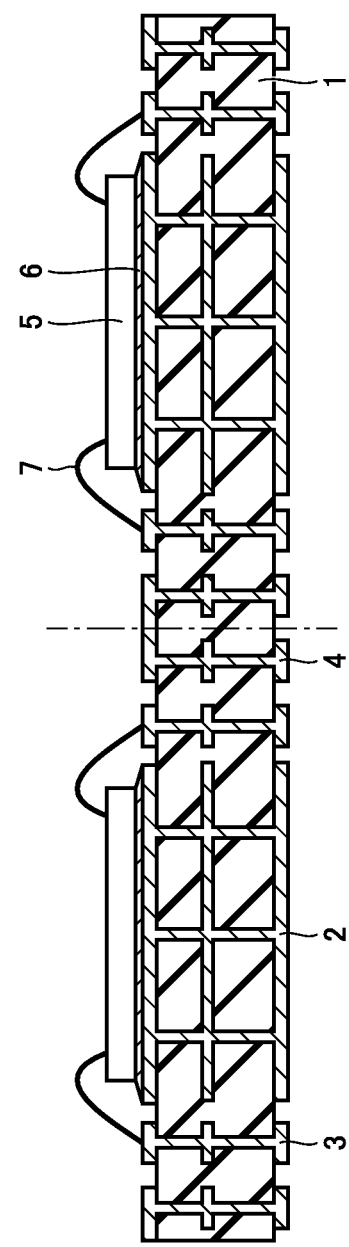
FIG. 3 is a schematic sectional view illustrating a step of manufacturing the semiconductor layer shown in FIG. 1.

In the method of manufacturing the semiconductor device according to the present embodiment, as shown in FIGS. 2 and 3, a plurality of semiconductor elements 5 are initially arranged on the surface of wiring board 1 (S10). FIG. 2 is a schematic sectional structural diagram illustrating a step of fixing semiconductor element 5 on wiring board 1 with adhesive 6 interposed therebetween, for the semiconductor device illustrated in the first embodiment. FIG. 3 is a schematic sectional structural diagram illustrating a step of electrically connecting signal conductor 3 of wiring board 1 and semiconductor element 5 through wire 7, for the semiconductor device illustrated in the first embodiment.

As shown in FIG. 2, in this step (S10), wiring board 1 is prepared from which a plurality of semiconductor devices can be collected. Heat dissipating conductor 2, signal conductor 3 and grounding conductor 4 are arranged in each region of wiring board 1 which will serve as each individual semiconductor device. A desired amount of adhesive 6 is supplied onto heat dissipating conductor 2 provided at the center of each region of wiring board 1 which will serve as each individual semiconductor device. Any method can be employed as a method of supplying adhesive 6. Subsequently, in each region which will serve as a semiconductor device, semiconductor element 5 is placed on adhesive 6 such that bubbles are not mixed between semiconductor element 5 and adhesive 6. A semiconductor element including a high frequency circuit can be used, for example, as semiconductor element 5. Wiring board 1 with semiconductor element 5 placed thereon is heated in an oven to about 150° C. to thereby cure adhesive 6.

Here, semiconductor element 5 including a high frequency circuit generates more heat than a normal semiconductor element. Therefore, to efficiently transfer heat generated by semiconductor element 5 to the outside through heat dissipating conductor 2 with regard to adhesive 6 for fixing semiconductor element 5 on wiring board 1, it is preferable to use a material having a high thermal conductivity as a material forming adhesive 6. Silver paste may be used, for example, as a material for adhesive 6. On the other hand, if a ratio of blending quantity of silver in the silver paste is increased too much in order to raise the thermal conductivity, the viscosity of the silver paste is increased. In this case, it is difficult easily to supply the silver paste as adhesive 6 onto heat dissipating conductor 2 (for example, to supply the silver paste in the same manner as printing). Therefore, the ratio of blending quantity of silver in the silver paste is preferably about 80 percent by weight. When using silver paste having an increased viscosity by increasing the ratio of blending quantity of silver in order to raise the thermal conductivity, an air pulse dispensing process in which a syringe is filled with silver paste and the silver paste is pushed out by air pressure can be employed as a method of arranging silver paste as adhesive 6 on heat dissipating conductor 2. With this process, a desired amount of silver paste can be accurately supplied onto heat dissipating conductor 2, to improve the efficiency of this work.

Next, as shown in FIG. 3, semiconductor element 5 and signal conductor 3 are connected by wire 7. Specifically, wiring board 1 with semiconductor element 5 mounted thereon is heated to about 100° C., and a ball bonding process is employed to connect wire 7 to semiconductor element 5 and signal conductor 3. Wiring is generally performed with a first bond point on the side of wire 7 that is attached to semiconductor element 5, and a second bond point on the side of wire 7 that is attached to signal conductor 3. However, if it is wished to produce a semiconductor device having a small thickness, the first bond point can be on the side of wire 7 that is attached to signal conductor 3, and the second bond point can be on the side of wire 7 that is attached to semiconductor element 5, so that wire 7 having a small height after bonding can be formed. As a result, the thickness of the semiconductor device can be reduced.

Figure 4:
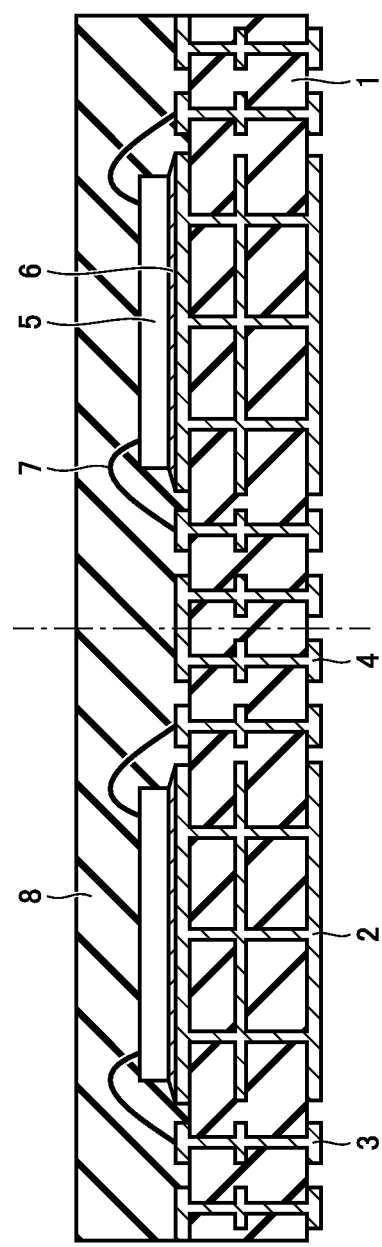
FIG. 4 is a schematic sectional view illustrating a step of manufacturing the semiconductor layer shown in FIG. 1.

Next, as shown in FIG. 4, insulating layer 8 is arranged on the surface of wiring board 1 to surround the plurality of semiconductor elements 5 (S20). FIG. 4 is a schematic sectional structural diagram illustrating a step of forming insulating layer 8 above wiring board 1 to surround semiconductor elements 5, for the semiconductor device illustrated in the first embodiment.

In this step (S20), for example, wiring board 1 with semiconductor elements 5 and wires 7 mounted thereon is put into a mold of about 250° C. and preheated. In this state, a transfer molding process is employed to arrange insulating layer 8 on wiring board 1 to cover semiconductor elements 5. Specifically, using a transfer molding apparatus, plastic molding resin in the form of semi-cured granules or pellets is heated and melted, injected into the aforementioned mold, and cured inside the mold while a high welding pressure is held. When the plastic molding resin is cured to a certain extent, wiring board 1 connected to this plastic molding resin is removed from the mold. Wiring board 1 is heated in an oven to about 150° C. to thereby completely cure the plastic molding resin. The structure shown in FIG. 4 is thus obtained.

Figure 5:
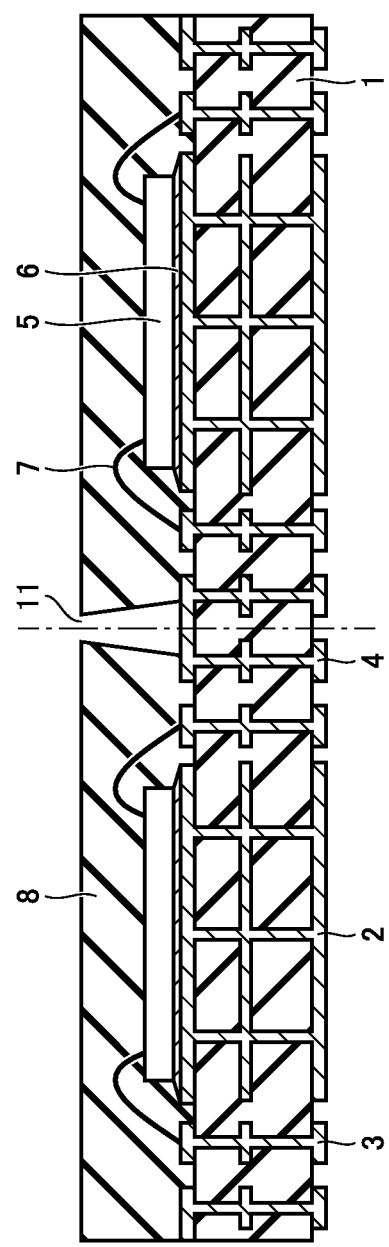
FIG. 5 is a schematic sectional view illustrating a step of manufacturing the semiconductor layer shown in FIG. 1.

Next, as shown in FIG. 5, a trench 11 is formed in insulating layer 8, which is located in a region between the plurality of semiconductor elements 5 and has a reverse tapered shape which is wider at wiring board 1 than at the upper surface of insulating layer 8 (S30). FIG. 5 is a schematic sectional structural diagram illustrating a step of forming trench 11 (also called a cut trench) in insulating layer 8 formed on wiring board 1, for the semiconductor device illustrated in the first embodiment.

In this step (S30), cut trench 11 is formed in insulating layer 8 using a laser processing machine (preferably, a $CO_2$ laser processing machine), for example. Since insulating layer 8 which is plastic molding resin has low reflectivity for laser beam and thus absorbs energy of laser beam well, this insulating layer 8 is more likely to be removed by laser beam. On the other hand, since grounding conductor 4 which is metal has high reflectivity for laser beam and thus does not absorb energy of laser beam well, this grounding conductor 4 is less likely to be removed by laser beam. For this reason, when trench 11 progresses in a depth direction by laser processing and extends through insulating layer 8 to expose grounding conductor 4, the progress of trench 11 in the depth direction stops without grounding conductor 4 being removed by the laser beam. As a result, automatic processing of trench 11 with high accuracy in the depth direction is possible. The laser beam reflected off a surface of grounding conductor 4 is utilized to remove insulating layer 8. The amount of insulating layer 8 removed by this reflected laser beam increases toward grounding conductor 4, causing the width in a lateral direction of trench 11 to increase toward grounding conductor 4. As a result, trench 11 having a reverse tapered shape which is wider toward wiring board 1 is formed. The structure shown in FIG. 5 is thus obtained.

Figure 6:
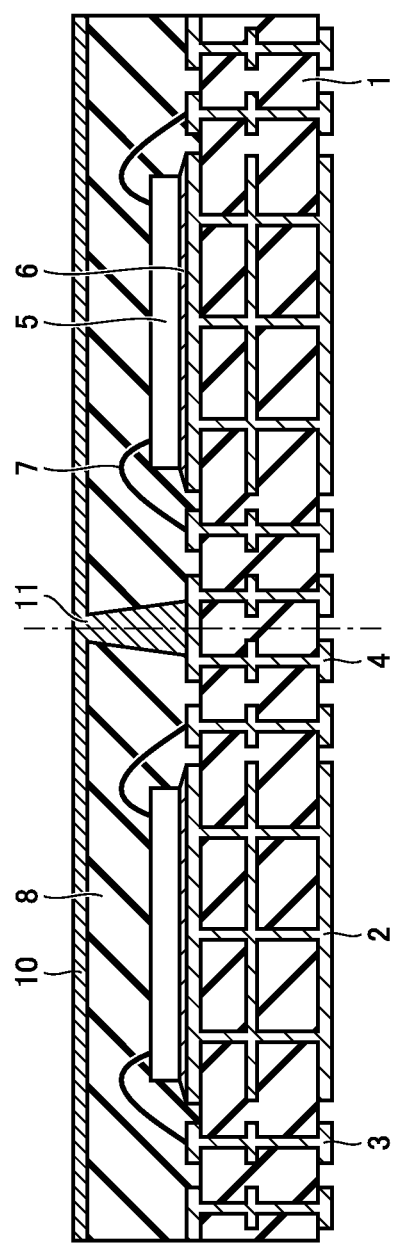
FIG. 6 is a schematic sectional view illustrating a step of manufacturing the semiconductor layer shown in FIG. 1.

Next, as shown in FIG. 6, conductor layer 10 is formed to cover the upper surface of insulating layer 8 and an inner peripheral surface of trench 11 (S40). FIG. 6 is a schematic sectional structural diagram illustrating a step of forming conductor layer 10 on the upper surface of insulating layer 8 and inside of trench 11, for the semiconductor device illustrated in the first embodiment. FIG. 7 is a schematic sectional structural diagram of an enlarged periphery of trench 11.

In this step (S40), a pressure printing process is employed, for example, to fill narrow and deep trench 11, without any gaps, with conductor paste which will serve as conductor layer 10. Subsequently, a screen printing process is employed, for example, to supply conductor paste which will serve as conductor layer 10 having a uniform thickness to the upper surface of insulating layer 8. Subsequently, heating is performed in an oven to about 120° C. to thereby cure conductor layer 10. Conductor layer 10 shown in FIGS. 6 and 7 is thus obtained. Since grounding conductor 4 is exposed at the bottom of trench 11, conductor layer 10 and grounding conductor 4 are consequently in contact with each other at the bottom of trench 11. Conductor layer 10 can thereby be electrically grounded.

Next, conductor layer 10 and wiring board 1 are divided at the position of trench 11 (S50). Specifically, in this step (S50), conductor layer 10 and wiring board 1 are cut into individual pieces by blade dicing using a blade narrower than the width of trench 11, for example. The semiconductor device according to the first embodiment shown in FIG. 1 is thus obtained.

<Function and Effect of Semiconductor Device>

In the semiconductor device according to the present embodiment described above, heat dissipating conductor 2 for fixing semiconductor element 5 is provided substantially at the center of wiring board 1. Signal conductor 3 for electrically connecting semiconductor element 5 is provided around heat dissipating conductor 2. Grounding conductor 4 for electrical grounding is provided around signal conductor 3. Semiconductor element 5 is fixed to heat dissipating conductor 2 of wiring board 1 with adhesive 6 interposed therebetween. Semiconductor element 5 is electrically connected to signal conductor 3 of wiring board 1 through wire 7. Insulating layer 8 is provided on the inner peripheral side of the upper surface of wiring board 1 to cover semiconductor element 5. Grounding conductor 4 provided on the outer peripheral side of wiring board 1 is partially or entirely exposed without being covered with insulating layer 8. At least a portion of the side surface of insulating layer 8 has a reverse tapered shape. Conductor layer 10 is provided to cover the upper surface and the side surface of insulating layer 8, and the outer peripheral side of wiring board 1. The portion having a reverse tapered shape of the side surface of insulating layer 8 (reverse tapered portion 9) is covered with conductor layer 10. Grounding conductor 4 provided on the outer peripheral side of wiring board 1 and partially or entirely exposed at insulating layer 8 is in contact with the lower end of conductor layer 10. Conductor layer 10 is thereby electrically grounded.

By forming grounding conductor 4 on wiring board 1 in advance and connecting conductor layer 10 to this grounding conductor 4 in this manner, conductor layer 10 can be grounded to form an electromagnetic shielding structure. Furthermore, since conductor layer 10 is in contact with the surface of reverse tapered portion 9 of the side surface of insulating layer 8, even if conductor layer 10 is going to dimensionally shrink when heated during heat treatment in the process of manufacturing the semiconductor device, the portion of conductor layer 10 in contact with the surface of reverse tapered portion 9 acts as a position fixing anchor, thereby suppressing the dimensional change (shrinkage) of conductor layer 10. Therefore, breakage of a connection portion between wiring board 1 and conductor layer 10 (namely, separation of conductor layer 10 from grounding conductor 4 of wiring board 1) due to this dimensional change can be prevented. As a result, the integrity of the electromagnetic shielding structure by conductor layer 10 can be maintained, so that the problem of inability of the semiconductor device to operate property due to a failure in this electromagnetic shield can be prevented from occurring.

In the semiconductor device described above, reverse tapered portion 9 extends from an upper end of the side surface of insulating layer 8 continuous with the upper surface to a lower end of the side surface of insulating layer 8 continuous with wiring board 1 as shown in FIG. 1. In this case, reverse tapered portion 9 is formed on the entire side surface of insulating layer 8, so that a sufficiently large area of contact between conductor layer 10 and reverse tapered portion 9 can be obtained.

Second Embodiment

<Configuration of Semiconductor Device>

Figure 8:
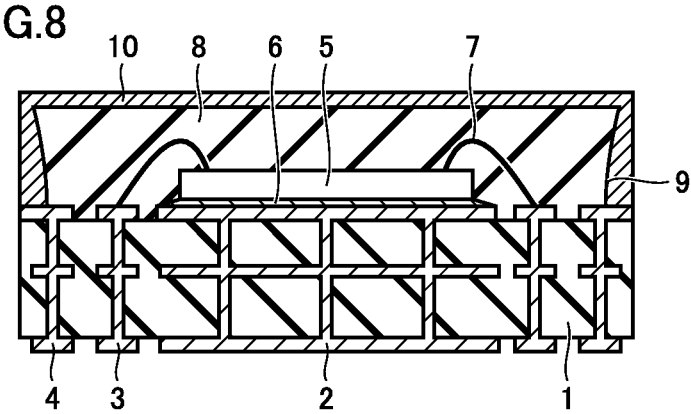
FIG. 8 is a schematic sectional view of a semiconductor device according to a second embodiment.

FIG. 8 is a schematic sectional structural diagram of a semiconductor device according to a second embodiment using a technique of the present invention. As shown in FIG. 8, the semiconductor device basically has a similar configuration to that of the semiconductor device shown in FIG. 1, but is different from the semiconductor device shown in FIG. 1 in the shape of reverse tapered portion 9. That is, in the semiconductor device shown in FIG. 8, the surface of reverse tapered portion 9 formed on the side surface of insulating layer 8 is curved to form a curved surface projecting toward the inner periphery of wiring board 1. Conductor layer 10 is formed in contact with this curved surface of reverse tapered portion 9.

<Method of Manufacturing Semiconductor Device>

A method of manufacturing the semiconductor device shown in FIG. 8 is similar to the method of manufacturing the semiconductor device of FIG. 1 described using FIGS. 2 to 7, but is different from the method of manufacturing the semiconductor device shown in FIGS. 2 to 7 in that an additional process is performed between the step (S30) shown in FIG. 5 and the step (S40). That is, after the step (S10) through step (S30) described in the first embodiment are performed to form trench 11, residues of insulating layer 8 may remain on the surface of grounding conductor 4 exposed at a bottom surface of trench 11. Thus, a step of slightly dissolving insulating layer 8 with an etching solution in order to remove the residues (S60) is performed. During this step, a side surface of trench 11 is slightly dissolved by the etching solution, causing reverse tapered portion 9 curved to project toward the inner periphery of wiring board 1 to be formed on the side surface of trench 11. Subsequently, by performing the step (S40) and the step (S50) described in the first embodiment, the semiconductor device shown in FIG. 8 can be obtained.

<Function and Effect of Semiconductor Device>

According to the semiconductor device shown in FIG. 8, similar effects to those of the semiconductor device shown in FIG. 1 can be produced, and since the surface of reverse tapered portion 9 is curved, a larger surface area of reverse tapered portion 9 can be obtained than when the surface of reverse tapered portion 9 is formed as a planar surface. Thus, the area of contact between conductor layer 10 and reverse tapered portion 9 can be relatively increased. As a result, the connection strength between the portion of conductor layer 10 in contact with the surface of reverse tapered portion 9 and reverse tapered portion 9 can be increased. Therefore, the effect of suppressing the dimensional change of conductor layer 10 can be further increased.

Third Embodiment

<Configuration of Semiconductor Device>

Figure 9:
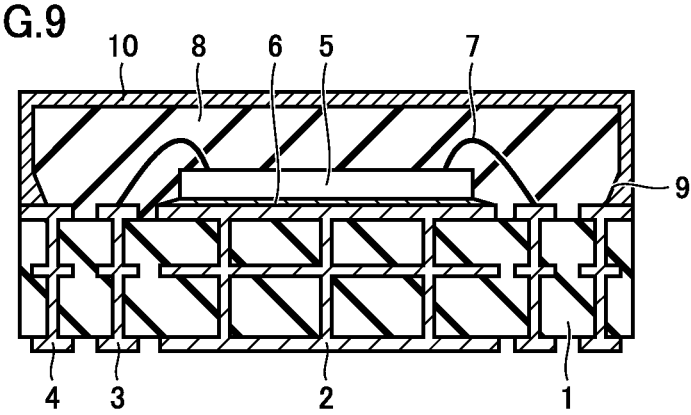
FIG. 9 is a schematic sectional view of a semiconductor device according to a third embodiment.

FIG. 9 is a schematic sectional structural diagram of a semiconductor device according to a third embodiment using a technique of the present invention. As shown in FIG. 9, the semiconductor device basically has a similar configuration to that of the semiconductor device shown in FIG. 1, except that reverse tapered portion 9 is formed on the lower side of the side surface of insulating layer 8. Reverse tapered portion 9 has a planar surface. Conductor layer 10 is formed in contact with the surface of reverse tapered portion 9.

<Method of Manufacturing Semiconductor Device>

A method of manufacturing the semiconductor device shown in FIG. 9 is similar to the method of manufacturing the semiconductor device of FIG. 1 described using FIGS. 2 to 7 (step (S10) through step (S50)), but is different from the method of manufacturing the semiconductor device shown in FIGS. 2 to 7 in process conditions in the step (S30) shown in FIG. 5. That is, when forming trench 11 shown in FIG. 5, the energy of the laser beam is weakened as compared to that in the first embodiment, to thereby relatively weaken the energy of the laser beam reflected off the surface of grounding conductor 4. As a result, the region where insulating layer 8 is removed in a width direction (trench 11 is widened in the width direction) by the laser beam reflected off the surface of grounding conductor 4 can be limited to the lower side of the side surface of insulating layer 8. In this manner, the semiconductor device having reverse tapered portion 9 located at the lower side of the side surface of insulating layer 8 as shown in FIG. 9 is obtained.

<Function and Effect of Semiconductor Device>

According to the semiconductor device shown in FIG. 9, similar effects to those of the semiconductor device shown in FIG. 1 can be produced. Furthermore, in the semiconductor device shown in FIG. 9, reverse tapered portion 9 is formed to extend from a position between the upper end of the side surface of insulating layer 8 continuous with the upper surface and the lower end of the side surface of insulating layer 8 continuous with wiring board 1 to the lower end (namely, only partially on the side surface). Thus, by setting the width in the width direction of trench 11 to be similar to that in the first embodiment in the above step (S30), the angle formed by the surface of reverse tapered portion 9 relative to the surface of wiring board 1 can be made smaller than that in the structure shown in FIG. 1. Accordingly, the anchoring effect of the portion of conductor layer 10 formed in contact with this reverse tapered portion 9 can be further increased.

Fourth Embodiment

<Configuration of Semiconductor Device>

Figure 10:
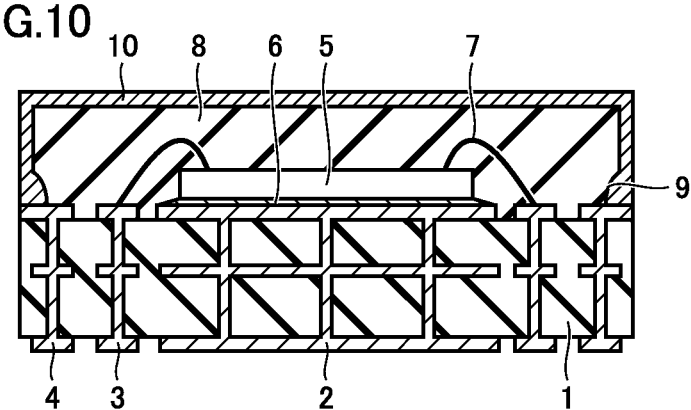
FIG. 10 is a schematic sectional view of a semiconductor device according to a fourth embodiment.

FIG. 10 is a schematic sectional structural diagram of a semiconductor device according to a fourth embodiment using a technique of the present invention. As shown in FIG. 10, the semiconductor device basically has a similar configuration to that of the semiconductor device shown in FIG. 9, but is different from the semiconductor device shown in FIG. 9 in the shape of reverse tapered portion 9. That is, in the semiconductor device shown in FIG. 10, the surface of reverse tapered portion 9 formed partially on the lower side of the side surface of insulating layer 8 is curved to form a curved surface projecting toward the inner periphery of wiring board 1. Conductor layer 10 is formed in contact with this curved surface of reverse tapered portion 9.

<Method of Manufacturing Semiconductor Device>

A method of manufacturing the semiconductor device shown in FIG. 10 is similar to the method of manufacturing the semiconductor device of FIG. 9, but is different from the method of manufacturing the semiconductor device shown in FIG. 9 in that an additional process is performed between the step (S30) shown in FIG. 5 and the step (S40). That is, after the steps described in the third embodiment are performed to form trench 11 whose side wall has been only partially widened in the width direction, the step of slightly dissolving insulating layer 8 with an etching solution in order to remove the residues of insulating layer 8 remaining on the surface of grounding conductor 4 exposed at the bottom surface of trench 11 (S60) is performed. During this step, the side surface of trench 11 is slightly dissolved by the etching solution, causing reverse tapered portion 9 curved to project toward the inner periphery of wiring board 1 to be formed on the side surface of trench 11. Subsequently, by performing the step (S40) and the step (S50) described in the first embodiment, the semiconductor device shown in FIG. 10 can be obtained.

<Function and Effect of Semiconductor Device>

According to the semiconductor device shown in FIG. 10, similar effects to those of the semiconductor device shown in FIG. 9 can be produced, and since the surface of reverse tapered portion 9 is curved, a larger surface area of reverse tapered portion 9 can be obtained than when the surface of reverse tapered portion 9 is formed as a planar surface. Thus, the area of contact between conductor layer 10 and reverse tapered portion 9 can be relatively increased. As a result, the connection strength between the portion of conductor layer 10 in contact with the surface of reverse tapered portion 9 and reverse tapered portion 9 can be increased. Therefore, the effect of suppressing the dimensional change of conductor layer 10 can be further increased.

Fifth Embodiment

<Configuration of Semiconductor Device>

Figure 11:
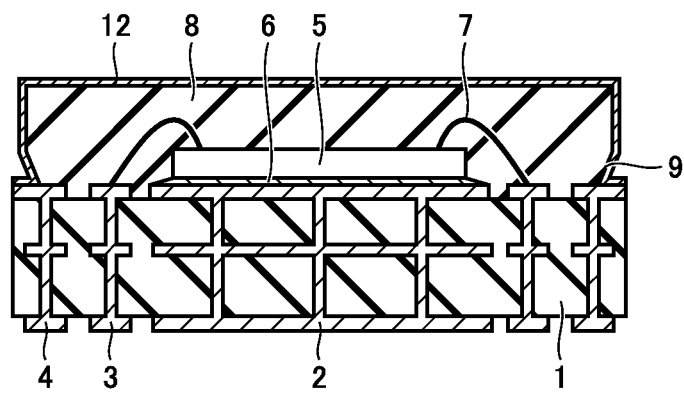
FIG. 11 is a schematic sectional view of a semiconductor device according to a fifth embodiment.

FIG. 11 is a schematic sectional structural diagram of a semiconductor device according to a fifth embodiment using a technique of the present invention. As shown in FIG. 11, the semiconductor device basically has a similar configuration to that of the semiconductor device shown in FIG. 9, except that a conductor film 12 in the form of a thin film is formed to cover the outer peripheral side of wiring board 1, and the upper surface and the side surface of insulating layer 8. Namely, the surface shape of a portion of conductor layer 10 that covers reverse tapered portion 9 is a shape along the shape of reverse tapered portion 9. Conductor film 12 includes an extension extending from over reverse tapered portion 9 to over grounding conductor 4 of wiring board 1. Conductor film 12 is a metal film made by sintering metal nanoparticle inks, for example. Conductor film 12 can have a thickness of not less than 1 μm and not more than 100 μm, or not less than 5 μm and not more than 50 μm, for example.

On the outer peripheral side of wiring board 1, grounding conductor 4 exposed at the outer periphery of insulating layer 8 and conductor film 12 are in contact with each other. Conductor film 12 is thereby electrically grounded, and therefore acts as an electromagnetic shield that shields an electromagnetic wave. In addition, the lower end on the outer peripheral side of conductor film 12 has a shape along reverse tapered portion 9 and grounding conductor 4 exposed on the outer peripheral side of wiring board 1.

<Method of Manufacturing Semiconductor Device>

Figure 12:
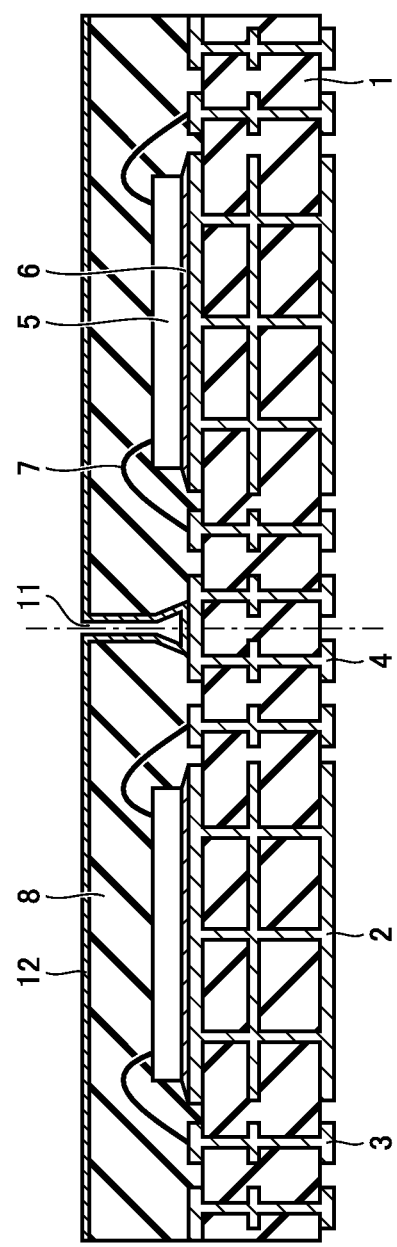
FIG. 12 is a schematic sectional view illustrating a step of manufacturing a semiconductor layer shown in FIG. 11.
Figure 13:
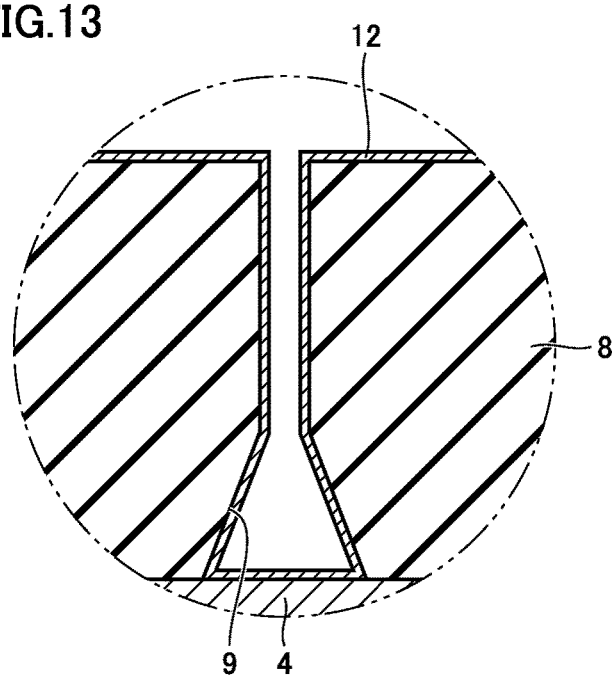
FIG. 13 is a partially enlarged schematic sectional view of FIG. 12.

A method of manufacturing the semiconductor device shown in FIG. 11 is described using FIGS. 12 and 13. FIG. 12 is a schematic diagram illustrating a step of forming conductor film 12 on the upper surface of insulating layer 8 and inside of trench 11, for the semiconductor device illustrated in the fifth embodiment. FIG. 13 is a schematic diagram of an enlarged periphery of trench 11 of FIG. 12.

The method of manufacturing the semiconductor device shown in FIG. 11 is basically similar to the method of manufacturing the semiconductor device shown in FIG. 9, where the steps described in the third embodiment are initially performed through the step (S30) of forming trench 11. Subsequently, as the step (S40), conductor film 12 in the form of a thin film is formed by a spraying process on the upper surface of insulating layer 8 and the inner surface of trench 11. Since trench 11 is a deep and narrow trench, it is preferable to employ an electrostatic spraying process by which a material can be sprayed in the form of a fine mist, and a uniform film (for example, a film of metal nanoparticle inks) can be formed on a surface having a complicated shape by utilizing electrostatic force, in order to form conductor film 12 having a uniform thickness on the inner surface of trench 11. Grounding conductor 4 is exposed at the bottom of trench 11. Thus, a film which will serve as conductor film 12 and grounding conductor 4 are in contact with each other at the bottom of trench 11 as shown in FIGS. 12 and 13. Subsequently, this film is heated in an oven to about 60° C. which is the sintering temperature of metal nanoparticle inks to thereby sinter the film. Conductor film 12 shown in FIGS. 12 and 13 is thus obtained. This conductor film 12 is connected to grounding conductor 4 at the bottom of trench 11 as described above. Subsequently, by performing the step (S50), the semiconductor device shown in FIG. 11 can be obtained.

<Function and Effect of Semiconductor Device>

According to the semiconductor device shown in FIG. 11, similar effects to those of the semiconductor device shown in FIG. 9 can be produced. Furthermore, in the semiconductor device shown in FIG. 11, the length of conductor film 12 is longer than the length of reverse tapered portion 9 on the side surface of insulating layer 8. Thus, when heat history such as reflow heating is applied to the semiconductor device illustrated in the present embodiment, even if conductor film 12 dimensionally shrinks and the lower end of conductor film 12 is thereby pulled to cause a portion of conductor film 12 to be peeled from the inner peripheral side of grounding conductor 4, conductor film 12 can be prevented from being completely peeled to the portion of grounding conductor 4 located on the outer peripheral side of wiring board 1. Accordingly, the lower end of conductor film 12 (end portion located on the outer peripheral side of wiring board 1) will not be peeled from the portion of grounding conductor 4 located on the outer peripheral side of wiring board 1, and thus the function of conductor film 12 of shielding an electromagnetic wave will not be compromised. Therefore, the semiconductor device illustrated in the present embodiment can function properly.

Sixth Embodiment

<Configuration of Semiconductor Device>

Figure 14:
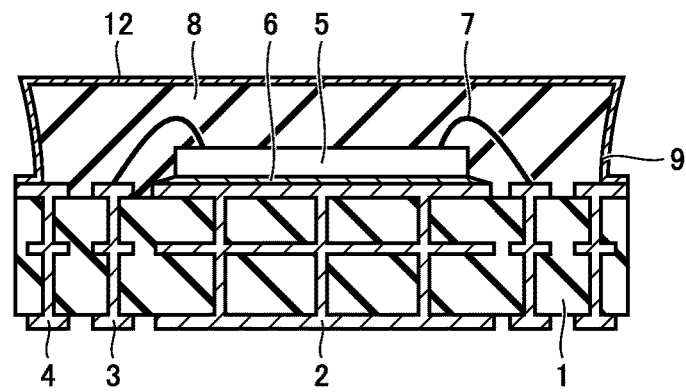
FIG. 14 is a schematic sectional view of a semiconductor device according to a sixth embodiment.

FIG. 14 is a schematic sectional structural diagram of a semiconductor device according to a sixth embodiment using a technique of the present invention. As shown in FIG. 14, the semiconductor device basically has a similar configuration to that of the semiconductor device shown in FIG. 8, except that conductor film 12 in the form of a thin film functioning as a magnetic shielding structure is formed to cover the outer peripheral side of wiring board 1, and the upper surface and the side surface of insulating layer 8, as in the fifth embodiment.

<Method of Manufacturing Semiconductor Device>

A method of manufacturing the semiconductor device shown in FIG. 14 is basically similar to the method of manufacturing the semiconductor device shown in FIG. 8, where the step (S10), the step (S20), the step (S30) and the step (S60) are initially performed as was described in the second embodiment. Subsequently, as the step (S40), conductor film 12 in the form of a thin film is formed by a spraying process, for example, on the upper surface of insulating layer 8 and the inner surface of trench 11, as in the fifth embodiment. It is preferable to employ an electrostatic spraying process to form a film (for example, a film of metal nanoparticle inks) which will serve as conductor film 12 having a uniform thickness on the inner surface of trench 11. Subsequently, this film is heated in an oven to about 60° C. which is the sintering temperature of metal nanoparticle inks to thereby sinter the film. Conductor film 12 is thus obtained. This conductor film 12 is connected to grounding conductor 4 at the bottom of trench 11 as described above. Subsequently, by performing the step (S50), the semiconductor device shown in FIG. 14 can be obtained.

<Function and Effect of Semiconductor Device>

According to the semiconductor device shown in FIG. 14, similar effects to those of the semiconductor device shown in FIG. 8 can be produced. Furthermore, as with the semiconductor device shown in FIG. 11, when heat history such as reflow heating is applied to the semiconductor device illustrated in the present embodiment, even if conductor film 12 dimensionally shrinks and the lower end of conductor film 12 is thereby pulled to cause a portion of conductor film 12 to be peeled from the inner peripheral side of grounding conductor 4, conductor film 12 can be prevented from being completely peeled to the portion of grounding conductor 4 located on the outer peripheral side of wiring board 1.

Seventh Embodiment

<Configuration of Semiconductor Device>

Figure 15:
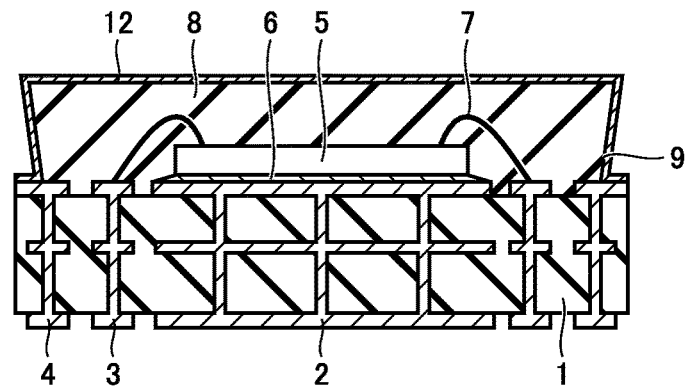
FIG. 15 is a schematic sectional view of a semiconductor device according to a seventh embodiment.

FIG. 15 is a schematic sectional structural diagram of a semiconductor device according to a seventh embodiment using a technique of the present invention. As shown in FIG. 15, the semiconductor device basically has a similar configuration to that of the semiconductor device shown in FIG. 1, except that conductor film 12 in the form of a thin film functioning as a magnetic shielding structure is formed to cover the outer peripheral side of wiring board 1, and the upper surface and the side surface of insulating layer 8, as in the fifth embodiment.

<Method of Manufacturing Semiconductor Device>

A method of manufacturing the semiconductor device shown in FIG. 15 is basically similar to the method of manufacturing the semiconductor device shown in FIG. 1, where the step (S10), the step (S20) and the step (S30) are initially performed as was described in the first embodiment. Subsequently, as the step (S40), conductor film 12 in the form of a thin film is formed by a spraying process, for example, on the upper surface of insulating layer 8 and the inner surface of trench 11, as in the fifth embodiment. It is preferable to employ an electrostatic spraying process to form a film (for example, a film of metal nanoparticle inks) which will serve as conductor film 12 having a uniform thickness on the inner surface of trench 11. Subsequently, this film is heated in an oven to about 60° C. which is the sintering temperature of metal nanoparticle inks to thereby sinter the film. Conductor film 12 is thus obtained. This conductor film 12 is connected to grounding conductor 4 at the bottom of trench 11 as described above. Subsequently, by performing the step (S50), the semiconductor device shown in FIG. 15 can be obtained.

<Function and Effect of Semiconductor Device>

According to the semiconductor device shown in FIG. 15, similar effects to those of the semiconductor device shown in FIG. 1 can be produced. Furthermore, as with the semiconductor device shown in FIG. 11, when heat history such as reflow heating is applied to the semiconductor device illustrated in the present embodiment, even if conductor film 12 dimensionally shrinks and the lower end of conductor film 12 is thereby pulled to cause a portion of conductor film 12 to be peeled from the inner peripheral side of grounding conductor 4, conductor film 12 can be prevented from being completely peeled to the portion of grounding conductor 4 located on the outer peripheral side of wiring board 1.

Eighth Embodiment

<Configuration of Semiconductor Device>

Figure 16:
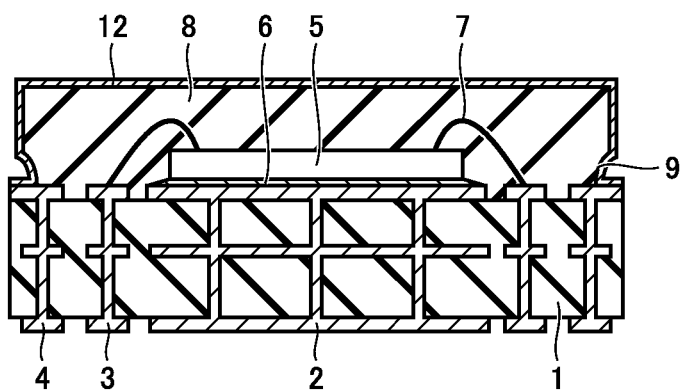
FIG. 16 is a schematic sectional view of a semiconductor device according to an eighth embodiment.

FIG. 16 is a schematic sectional structural diagram of a semiconductor device according to an eighth embodiment using a technique of the present invention. As shown in FIG. 16, the semiconductor device basically has a similar configuration to that of the semiconductor device shown in FIG. 10, except that conductor film 12 in the form of a thin film functioning as a magnetic shielding structure is formed to cover the outer peripheral side of wiring board 1, and the upper surface and the side surface of insulating layer 8, as in the fifth embodiment.

<Method of Manufacturing Semiconductor Device>

A method of manufacturing the semiconductor device shown in FIG. 16 is basically similar to the method of manufacturing the semiconductor device shown in FIG. 10, except that, after forming trench 11 whose side wall has been only partially widened in the width direction, as the step (S40), conductor film 12 in the form of a thin film is formed by a spraying process, for example, on the upper surface of insulating layer 8 and the inner surface of trench 11, as in the fifth embodiment. It is preferable to employ an electrostatic spraying process to form a film (for example, a film of metal nanoparticle inks) which will serve as conductor film 12 having a uniform thickness on the inner surface of trench 11. Subsequently, this film is heated in an oven to about 60° C. which is the sintering temperature of metal nanoparticle inks to thereby sinter the film. Conductor film 12 is thus obtained. This conductor film 12 is connected to grounding conductor 4 at the bottom of trench 11 as described above. Subsequently, by performing the step (S50), the semiconductor device shown in FIG. 16 can be obtained.

<Function and Effect of Semiconductor Device>

According to the semiconductor device shown in FIG. 16, similar effects to those of the semiconductor device shown in FIG. 10 can be produced. Furthermore, as with the semiconductor device shown in FIG. 11, when heat history such as reflow heating is applied to the semiconductor device illustrated in the present embodiment, even if conductor film 12 dimensionally shrinks and the lower end of conductor film 12 is thereby pulled to cause a portion of conductor film 12 to be peeled from the inner peripheral side of grounding conductor 4, conductor film 12 can be prevented from being completely peeled to the portion of grounding conductor 4 located on the outer peripheral side of wiring board 1.

Although the embodiments of the present invention have been described above, the embodiments described above can be modified in various ways. The scope of the present invention is not limited to the embodiments described above. The scope of the present invention is defined by the terms of the claims, and is intended to include any modifications within the scope and meaning equivalent to the terms of the claims.

INDUSTRIAL APPLICABILITY

The present invention is applied particularly advantageously to a semiconductor device having contained therein a semiconductor element in which a high frequency circuit is formed.

REFERENCE SIGNS LIST 1 wiring board; 2 heat dissipating conductor; 3 signal conductor; 4 grounding conductor; 5 semiconductor element; 6 adhesive; 7 wire; 8 insulating layer; 9 reverse tapered portion; 10 conductor layer; 11 trench; 12 conductor film.

The invention claimed is:

1. A semiconductor device comprising:
a wiring board having a surface;
a semiconductor element arranged on the surface;
an insulating layer located on the surface and arranged to surround the semiconductor element; and
a conductor layer covering an outer peripheral surface of the insulating layer and connected to the wiring board,
the outer peripheral surface of the insulating layer including an upper surface located over the semiconductor element, and a side surface connecting the upper surface and the wiring board,
the side surface including a reverse tapered portion,
the conductor layer being in contact with a surface of the reverse tapered portion and covering the side surface of the insulating layer by one element.

2. The semiconductor device according to claim 1, wherein
the surface of the reverse tapered portion is curved.

3. The semiconductor device according to claim 1, wherein
the reverse tapered portion extends from an upper end of the side surface continuous with the upper surface to a lower end of the side surface continuous with the wiring board.

4. The semiconductor device according to claim 1, wherein
the reverse tapered portion extends from a position between an upper end of the side surface continuous with the upper surface and a lower end of the side surface continuous with the wiring board to the lower end.

5. The semiconductor device according to claim 1, wherein
a surface shape of a portion of the conductor layer that covers the reverse tapered portion is a shape along a shape of the reverse tapered portion.

6. The semiconductor device according to claim 1, wherein
the conductor layer is provided on the surface of the wiring board and is not provided on a side surface of the wiring board.

7. The semiconductor device according to claim 1, wherein
a grounding conductor is provided on the surface of the wiring board and contacts a bottom side of the conductor layer.

8. A method of manufacturing a semiconductor device, comprising:
arranging a plurality of semiconductor elements on a surface of a wiring board;
arranging an insulating layer on the surface to surround the plurality of semiconductor elements;
forming a trench in the insulating layer, the trench located in a region between the plurality of semiconductor elements and having a reverse tapered shape which is wider at the wiring board than at an upper surface of the insulating layer;
forming a conductor layer to cover the upper surface of the insulating layer and an inner peripheral surface of the trench; and
dividing the conductor layer and the wiring board at a position of the trench so as to form the insulating layer with the reverse tapered shape and the conductor layer covering the insulating layer.

9. The method of manufacturing the semiconductor device according to claim 8, wherein
arranging a grounding conductor on a surface of the wiring board before forming the trench, and
forming the trench in the insulating layer by reflecting a laser beam off a surface of the grounding conductor to remove portions of the insulating layer.

* * * * *